US006860008B2

(12) United States Patent
Bodenhausen et al.

(10) Patent No.: US 6,860,008 B2
(45) Date of Patent: Mar. 1, 2005

(54) PROCESS FOR PRODUCING A FUEL RAIL WITH INTEGRATED INJECTION VALVES

(75) Inventors: Eckhard Bodenhausen, Steinheim (DE); Franco Zeleny, Besigheim (DE); Horst Kirschner, Brackenheim-Hausen (DE)

(73) Assignee: Robert Bosch GmbH, Stuttgart (DE)

( * ) Notice: Subject to any disclaimer, the term of this patent is extended or adjusted under 35 U.S.C. 154(b) by 237 days.

(21) Appl. No.: 10/200,976

(22) Filed: Jul. 24, 2002

(65) Prior Publication Data

US 2003/0019477 A1 Jan. 30, 2003

(30) Foreign Application Priority Data

Jul. 25, 2001 (DE) ........................................ 101 36 050

(51) Int. Cl.$^{7}$ ........................ H01R 43/00; H05K 13/00

(52) U.S. Cl. .......................... 29/855; 29/515; 29/527.1; 29/888.46; 29/890.08; 123/456; 123/470; 251/129.21

(58) Field of Search ....................... 29/855, 515, 527.1, 29/888.46, 890.08; 123/456, 470; 251/129.21

(56) References Cited

U.S. PATENT DOCUMENTS

| | | | | |
|---|---|---|---|---|
| 5,584,704 A | * | 12/1996 | Romann et al. ............ | 439/130 |
| 5,706,787 A | * | 1/1998 | Fujikawa .................... | 123/470 |
| 5,718,206 A | * | 2/1998 | Sawada et al. ............ | 123/470 |

FOREIGN PATENT DOCUMENTS

| | | |
|---|---|---|
| DE | 43 25 980 A1 | 2/1995 |
| DE | 195 46 441 A1 | 6/1997 |
| DE | 197 57 347 A1 | 6/1998 |
| WO | WO 99/40315 | 8/1999 |

* cited by examiner

*Primary Examiner*—Carl J. Arbes
*Assistant Examiner*—Tim Phan
(74) *Attorney, Agent, or Firm*—Ronald E. Greigg

(57) ABSTRACT

A method for producing fuel rails, which contain a hollow chamber that communicates with a fuel source via a connection. The fuel rail supplies fuel to a number of injection valves. At least one preassembled unit of an injection valve is integrated into the fuel rail by means of a materially adhesive connection during the production of the fuel rail and an electrical contacting of the individual injection valves is produced at the same time.

7 Claims, 4 Drawing Sheets

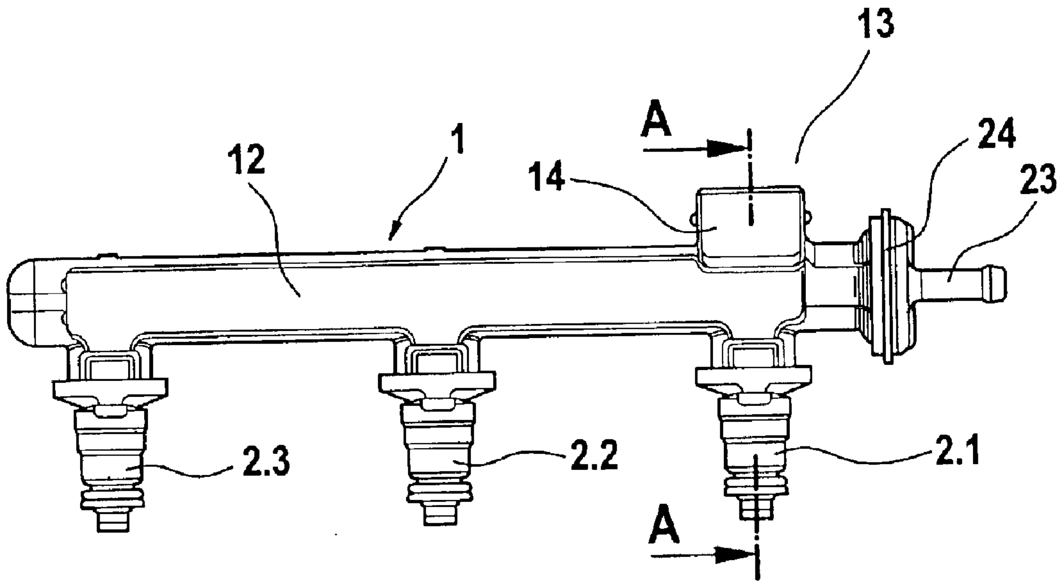
Fig. 3
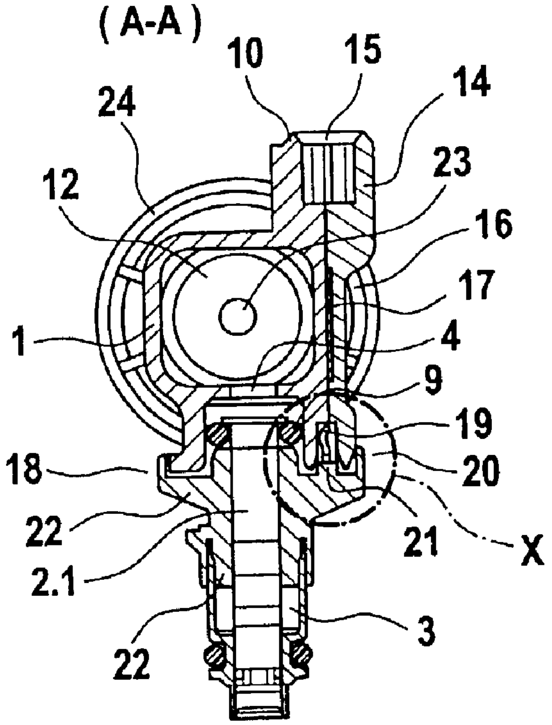
Fig. 3.1
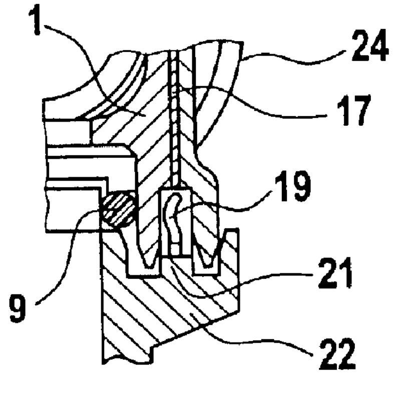
Fig. 3.2

PROCESS FOR PRODUCING A FUEL RAIL WITH INTEGRATED INJECTION VALVES

CROSS REFERENCE TO RELATED DOCUMENTS

This application claims the benefit of German Application No. 1 01 36 050.9, filed Jul. 25, 2001.

BACKGROUND OF THE INVENTION

1. Field of the Invention

In internal combustion engines, fuel rails are used, which serve to contain injection valves that supply fuel to the individual combustion chambers of the engine. The aim is to distribute the fuel to the individual injection valves as uniformly is possible, which applies to both conventional fuel supply systems and returnless fuel supply systems. Injection valves inserted into fuel rails are subsequently affixed to the fuel rail by means of securing clamps. Then the injection valves are electrically contacted by means of individual plugs from the wiring harness of the internal combustion engine.

2. Prior Art

The subject of DE 37 25 980 A1 is a device for electrically contacting electromagnetically actuatable fuel injection valves. In order to prevent the electrical contacting of fuel injection valves for fuel injection systems of internal combustion engines, the invention proposes plugging individual electric plugs, which are each connected to an electronic control unit, one after the other onto each of the individual fuel injection valves. According to this embodiment, the individual plugs associated with each of the fuel injection valves are connected to a common contacting strip. The common contacting strip can be fastened to the internal combustion engine by means of screws. The common contacting strip is connected to the electronic control unit by means of cables.

DE 39 07 764 A1 relates to a fuel rail for fuel injection systems of internal combustion engines. This fuel rail includes at least one fuel injection valve and one valve support that has at least one axially open stepped receiving bore for the fuel injection valve, which bore is connected to a fuel supply line. The receiving bore is surrounded by an end flange on which the fuel injection valve is axially supported by means of a collar element. The end flange of the valve support and the collar of fuel the injection valve are embodied as reciprocally corresponding parts of a bayonet lock.

DE 43 25 980 A1 relates to a device for the joint electrical contacting of a number of electrically excitable units of internal combustion engines.

The device for the joint electrical contacting of a number of units includes contact pins for electrical contacting. In addition, a printed circuit board with strip conductors is provided, which extends over all of the units, and is provided with a housing for protecting the printed circuit board, which extends in the longitudinal direction of the printed circuit board and at least partially encompasses it. The multiplicity of electrically excitable units, in particular electromagnetically actuatable fuel injection valves, are connected directly to the strip conductors of the printed circuit board by means of the contact pins; the printed circuit board has elastic expansion loops for longitudinal compensation. The contact pins of the units are inserted into contact pin receiving openings of the printed circuit board and are connected to the strip conductors by means of welding.

DE 195 46 441 A1 discloses a fuel rail for fuel injection systems of internal combustion engines, which supplies at least two fuel injection valves. The fuel rail includes a fuel supply conduit with a number of valve receptacles that corresponds to the number of fuel injection valves to be supplied. The valve receptacles include valve receptacle openings, which communicate directly with the fuel supply conduit and into which the fuel injection valves can be inserted so that the valve receptacles at least partially encompass fuel injection valves. Electrical lines for electrically contacting the at least two fuel injection valves in the fuel rail, which is embodied as a shaped plastic part, are integrated directly into this fuel rail, the electrical lines being sheathed in plastic over most of their length. The electrical lines extend in the form of flat bands in the fuel rail. The electrical lines extend largely along the longitudinal span of the fuel rail, i.e. along the fuel supply conduit; in the vicinity of a valve receptacle, each electrical line is bent in order to be routed to contact elements of the fuel injection valves.

OBJECT AND SUMMARY OF THE INVENTION

The embodiment proposed according to the invention permits the functional group of the injection valve to be integrated into the functional group of the fuel rail, eliminating mounting components such as securing clamps or individual plug connections to the individual injection valves. In the integration of the functional group of the injection valve into the functional group of the fuel rail, the geometry of the respective components is not altered. Now, the electrical and hydraulic contacting can be executed in a single installation step, saving a number of intermediary steps thus permitting an efficiency increase in the production of fuel supply lines with fuel rails.

The embodiment proposed according to the invention can also achieve a reduction in the size of fuel rails so that they require less space in the cylinder head region of internal combustion engines. Furthermore, previously required installation components such as securing clamps, individual plug connectors, and partial wiring harnesses in the internal combustion engine can be eliminated since the electrical control of the separate injection valves in the fuel rail can take place by means of a central plug connector externally affixed to the fuel rail.

The process proposed according to the invention also reduces fuel permeation through the connection point between the fuel rail and the injection valve unit, since this connection point is now contained directly on the fuel rail component either by means of a rigidly joined, materially adhesive connection or through an encapsulation of the sealing ring in the case of a crimped, materially adhesive connection. The integration of the injection valve unit directly into the fuel rail component also leads to an increase in the rigidity of the fuel rail and therefore to a better dynamic behavior of the fuel rail with the vibrations and shocks that necessarily occur during operation of a motor vehicle. Combining the individual electrical contacts of the injection valves on the fuel rail by means of a central plug connector can also achieve a savings of material to the extent that partial wiring harnesses and individual supply line connections to the individual injection valves of the engine in the cylinder head region can be eliminated. The electrical contacts of the injection valves are better protected from mechanical and climatic influences, for example the penetration of moisture, by means of a cover that is provided on the fuel rail.

BRIEF DESCRIPTION OF THE DRAWINGS

The invention will be better understood and further objects and advantages thereof will become more apparent from the ensuing detailed description of preferred embodiments taken in conjunction with the drawings, in which:

FIG. 3 shows a longitudinal section through a fuel rail, which supplies fuel to a number of fuel injection valves, FIG. 3.1 shows a section through the fuel rail according to the depiction in FIG. 3, along the cutting line A—A, FIG. 3.2 gives an enlarged depiction of the materially adhesive connection between the valve body and the fuel rail.

DESCRIPTION OF THE PREFERRED EMBODIMENTS

Figure 1:
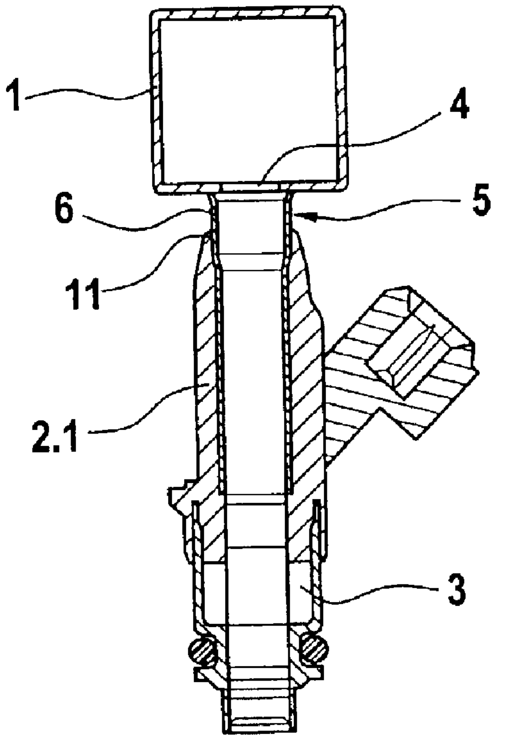
FIG. 1 shows a fuel rail with an integrated injection valve, these parts being connected to each other by means of a rigidly materially adhesive connection in the collar region of a sleeve.

The depiction according to FIG. 1 is intended to show a fuel rail with an integrated injection valve.

A sleeve 5 is fastened in the upper region of the injection valve 2.1. The lower region of the injection valve 2.1 has a hollow chamber 3; an electrical contact is provided at the side. The sleeve 5 permits the valve body of the injection valve 2.1 and a fuel rail 1 shown here in a cross sectional view to communicate with each other by means of a through bore 4. The fuel rail 1 and the injection valve 2.1 are connected to each other in a materially adhesive manner at the collar 6 of the sleeve 5. The materially adhesive connection 11 between the fuel rail 1 and the upper sleeve 5 in the collar region 6 can be produced, for example, by means of laser welding using an appropriately designed welding device.

Figure 2:
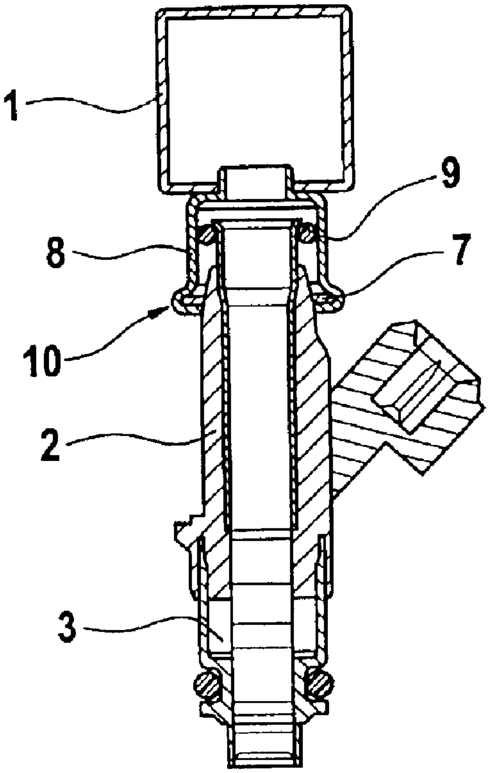
FIG. 2 shows a fuel rail with an injection valve connected to it in a materially adhesive fashion by means of a crimp being formed over a flange ring.

FIG. 2 shows a connection between a fuel rail 1 and an injection valve 2.1 by means of crimping.

By contrast to the depiction according to FIG. 1, the fuel rail 1 shown in FIG. 2 has a cup-shaped region, which encompasses the valve body of the injection valve 2.1 in its upper region. A sealing ring 9 is accommodated between the inner wall of the cup-shaped region 8 and the sleeve 5 on the injection valve 2.1. A flange ring 7 that encompasses the outer surface of the valve body of the injection valve 2.1 is provided underneath the sleeve 5 in the upper region of the valve body of the injection valve 2.1. The lower edge of the cup-shaped region 8 of the fuel rail 1 is crimped around the flange ring 7 off the valve body of the injection valve 2.1 so that a crimp 10 is formed. By means of the crimp connection 10, the valve body of the injection valve 2.1 is connected to the fuel rail 1 in a materially adhesive or form fitting manner, which permits an improvement or a reduction of the fuel permeation through direct connection of the injection valves to the fuel rail 1.

The depiction according to FIG. 3 shows a longitudinal section through a fuel rail with a number of injection valves integrated into it.

The fuel rail 1, which can be made of plastic for example, contains a hollow chamber 12, which can be filled with fuel by means of a connection 23 to a fuel reservoir not shown here or a fuel pump by means of an interposed filter element 24. The individual injection valves 2.1, 2.2, and 2.3 are supplied with fuel from the hollow chamber 12 inside the fuel rail made of plastic. The fuel rail 1 according to the depiction in FIG. 3 has a central plug connector, which is comprised of a plug component 13 on the housing side and a cover 14 that covers this plug component.

FIG. 3.1 shows a cross section through the fuel rail in the vicinity of the injection valve 2.1, along section line A—A.

The sectional depiction according to FIG. 3.1 shows that a central plug connection 15 is embodied on the one hand by means of a central plug housing 13 and a cover element 14 that can be attached to it. A pressed screen receptacle 16 in the fuel rail 1 extends from the central plug connection and contains a pressed screen 17 for electrically contacting the respective injection valve 2.1, 2.2, or 2.3. The pressed screen 17 extends to the base of the fuel rail 1. The cross sectional depiction in FIG. 3.1 also shows the connection 23 by means of which the hollow chamber 12 of the fuel rail 1 can be supplied with fuel. In the depiction according to FIG. 3.1, the reference numeral 24 is used to indicate the filter element that is disposed between the fuel connection 23 and the hollow chamber 12 of the fuel rail 1.

Between the fuel rail 1 according to the depiction in FIG. 3, which is made of plastic for example, and an injection valve body 22 of the injection valve 2.1, a materially adhesive connection 18 is produced along a specially created connection geometry 20. The materially adhesive connection 18 can, for example, be produced by means of ultrasonic welding for which a special connection geometry of the fuel rail 1 and the injection valve body 22 must be provided in the form of an annular projection 21. At the same time as the materially adhesive joining of the fuel rail 1 and the injection valve body 22, along the separately produced connection geometry 20, an electrical contacting of the injection valve 2.1 is produced by sliding together the pressed screen 17 contained in the plug receptacle 16 and the plug connector tabs 19 that protrude from the injection valve body 22 (see the detailed depiction in FIG. 3.2).

From the hollow chamber 12 of the fuel rail 1, the fuel entering by means of the connection 23 flows via the through bore 4 in the direction of the injection valve 2.1; a number of injection valves 2.1, 2.2, or 2.3 can be integrated into a fuel rail 1, extending perpendicular to the plane of the drawing shown in FIG. 3.1.

FIG. 3.2 gives an enlarged depiction of the electrical contacting of the injection valve.

Along the connection geometry 20 (see the depiction according to FIG. 3.1), the fuel rail 1 and injection valve body 22 of the injection valve 2.1 are connected to each other in a materially adhesive fashion. In order to facilitate the production of a materially adhesive connection, the connection geometry 20 includes an approximately annular projection 21. A connector tab 19 is provided above the annular projection 21. When the fuel rail 1 is joined to the valve body 22 of the injection valve 2.1, contact between the pressed screen 17 and the connector tab 19 of the injection valve 2.1 constitute the electrical contact of the injection valve 2.1. The pressed screen 17 in the fuel rail 1 includes a number of strip conductors that are not shown here that are respectively connected to the individual injection valves 2.1, 2.2, and 2.3, which are supplied via the fuel rail 1 and on the other hand, all come together in the central plug connection 15, and are centrally connected to a wiring harness of the internal combustion engine that is not shown here.

Figure 4:
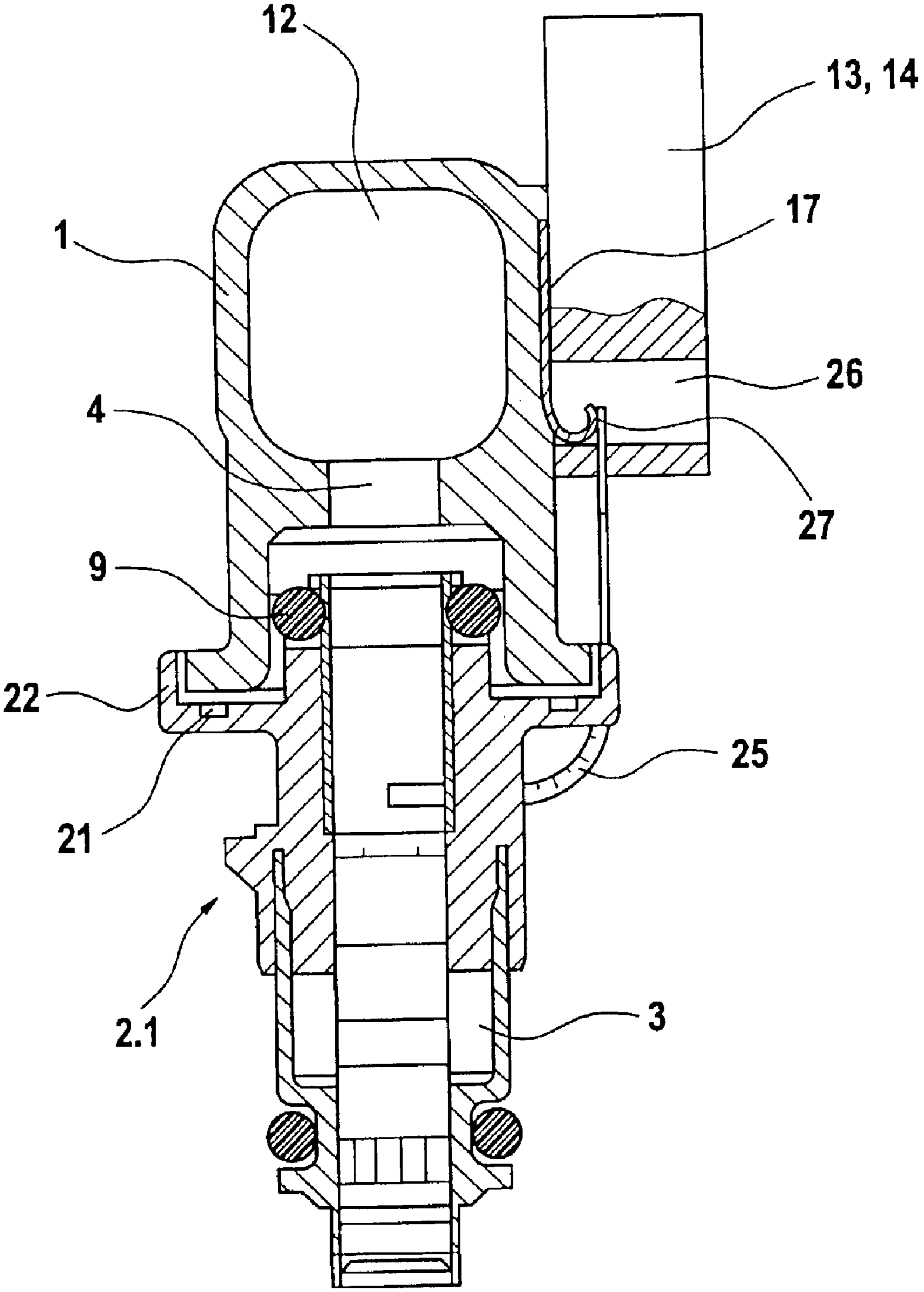
FIG. 4 shows a cross section through the fuel rail and an injection valve integrated into it, together with electrical contacts.

FIG. 4 shows an injection valve, which is integrated into the fuel rail.

The injection valve 2.1 shown in FIG. 4 includes a hollow chamber 3; the injection valve body 22 is fastened to the base of the fuel rail 1 along the connection geometry 20. In order to facilitate the fastening, which can be produced by means of a rigid connection produced by means of ultrasonic welding, an annular recess is provided in the joining region on the injection valve body 22.

A sealing ring 9 accommodated between the base of the fuel rail 1 and the upper region of the injection valve body 22 can be used to seal the injection valve 22 and in particular, to limit the leakage of fuel.

When producing the materially adhesive connection 18 between the fuel rail 1 and the injection valve body 22 in the vertical direction, the pressed screen 17 and the cable connection 25 of the injection valve 2.1 come together inside a contacting recess 26 so that the pressed screen 17 and the connector tab of the electrical connection 25 connect in the vicinity of a contact point 27 and produce an electrical contact. After the electrical contact 27 has been produced between the pressed screen 17 and the connector tab 19 of the electrical conductor 25, the contacting recess 26 is encapsulated so that the electrical connection is protected from external influences. Since a rigid or materially adhesive connection 18 is produced between the fuel rail 1 and injection valve body 22, the injection valve 2.1 can no longer be removed from the fuel rail 1 and the electrical contact 27 between the pressed screen 17 and the connector tab 19 can no longer be broken.

Figure 5:
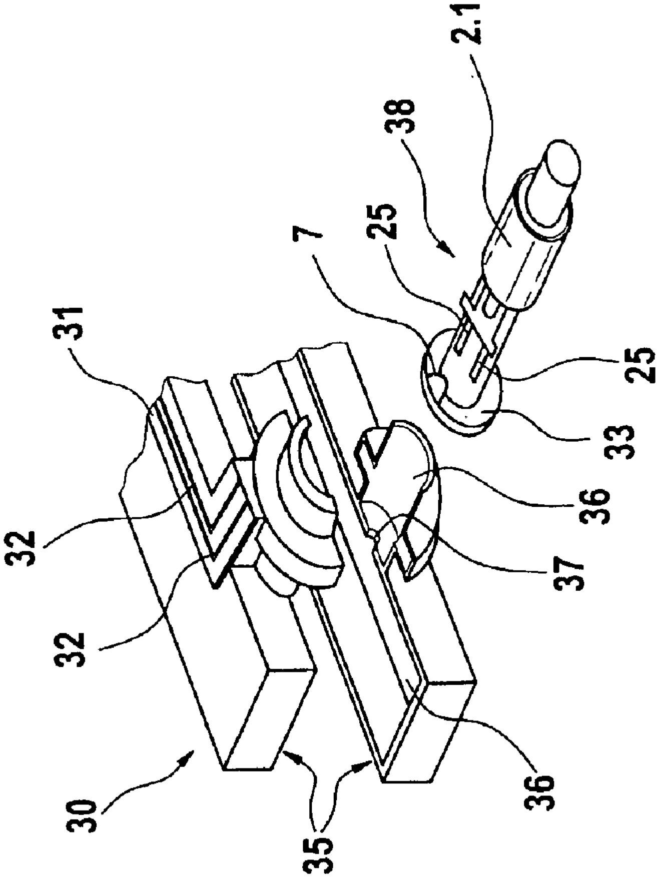
FIG. 5 shows the core positions of insert cores and a preassembled injection valve unit produced as an insert valve.

FIG. 5 shows the production of a fuel rail that is designed in one piece, with insert assemblies.

According to the depiction in FIG. 5, the injection valve 2.1 constitutes a preassembled unit 38, which has electrical connections 25 embodied on it. On the other hand, the preassembled unit 38 includes a pre-molded part 33 to which a sealing ring 9 is affixed. The preassembled unit 38 of the injection valve 2.1 is positioned in a complete injection molding die in the same way as the cores, which in insertion positions 36, constitute the hollow chamber 12 of the fuel rail as well as the inlet to the injection valve 2.1 to be cast in place in the fuel rail 30. With a complete molding-in of the cores inserted into the injection molding die, the sealing ring 7 supported on the pre-molded part 33 is likewise molded-in so that on the one hand, a materially adhesive containment of the injection valve 2.1 is produced, which valve is to be inserted into the injection molding die as a preassembled unit 38, and on the other hand, a direct contact production of the one-piece fuel rail 30 is achieved through contact of the strip conductors 32 with the electrical connection lines 25 on the preassembled unit 38. The bores required for the withdrawal of the cores are filled by means of plugs. The functional group 38 of the injection valve 2.1 is contacted at the contact pins 21 by the electrical strip conductors 32 before being molded-in. Then the preassembled unit 38 is completely extrusion coated by the injection molding die. The injection molding die is embodied to assure the hydraulic contacting of the functional groups 38. Additional slide valves are required for this, which are guided perpendicular to the main slide valve that produces the hollow chamber 12 of the fuel rail 30. Then, the openings on the top of the fuel rail 30, which are required for the removal of the cores used to produce the hollow spaces 36 to be provided for the injection valves 2.1 in the one-piece fuel rail 30, are closed.

Figure 6:
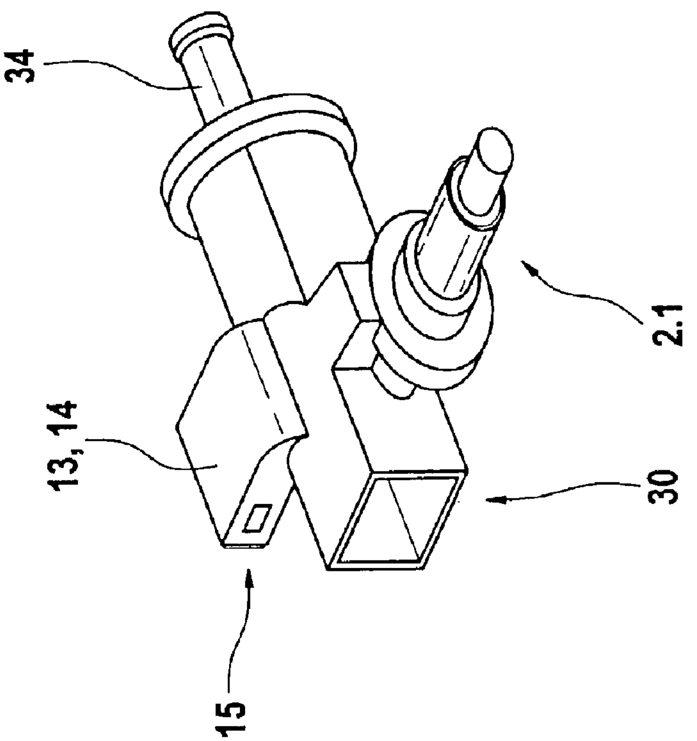
FIG. 6 shows a fuel rail, which has an integrated injection valve and is produced as a one-piece injection molded part with a central plug connector injection molded onto it.

FIG. 6 is a perspective view of a one-piece fuel rail 30 into which an injection valve 2.1 embodied as a preassembled unit 38 is molded in a materially adhesive fashion. On top of the one-piece fuel rail 30, a central plug connection 15 is provided, which is comprised on the one hand of a plug housing 13 and on the other hand of a cover 14 that covers this housing. The reference numeral 34 is used to label a connection to a fuel source that is not shown here.

The advantages that can be achieved with the embodiments shown in FIGS. 3 to 6 can be seen in that the embodiment proposed according to the invention permits a significant size reduction in comparison to fuel rails currently in use. The elimination of previously used separate mounting components such as securing clamps and individual valve plug connections can achieve a significantly more efficient production of fuel rails, regardless of whether they are embodied in one piece or multiple pieces. The materially adhesive connection or the materially adhesive integration of the individual injection valves 2.1, 2.2, 2.3 to/into the fuel rail 1, 30 permits an improvement or a reduction of the fuel penetration or leaking by fastening the injection valves 2.1 directly into the fuel rail 1, 30. In particular, a better encapsulation of the sealing ring 9 can be achieved, which ring produces the seal. The materially adhesive integration of the injection valves 2.1, 2.2, 2.3, which are embodied for example as preassembled units 38, permits an increase in the rigidity of the fuel rail to be achieved, which improves its dynamic behavior. The uniting of the previously provided individual contacts for the individual injection valves into a central plug connector permits the elimination of separate partial wiring harnesses for the individual injection valves and permits installation steps to be saved and requires the storage of fewer components. The covering element 14 provided on the central plug connector 15 protects the electrical contacts better, in particular from mechanical and climatic external influences.

The foregoing relates to preferred exemplary embodiments of the invention, it being understood that other variants and embodiments thereof are possible within the spirit and scope of the invention, the latter being defined by the appended claims.

We claim:

1. A method for producing fuel rails (1, 30), which contain a hollow chamber (12) that communicates with a fuel source via a connection (23) and which supply fuel to a number of injection valves (2.1, 2.2, 2.3), the method comprising providing a preassembled unit (3, 5, 9; 22, 38) of an injection valve (2.1, 2.2, 2.3), integrating the preassembled unit into the fuel rail (1, 30) with a materially adhesive connection (10, 11, 18, 33) during the production of the fuel rail (1, 30) as a one piece unit by an injection molding process, and, simultaneously producing an electrical contacting (17, 19, 27, 25, 32) of the injection valves (2.1, 2.2, 2.3).

2. The method according to claim 1, wherein the materially adhesive connection (18) between a fuel rail (1) and the valve body (22) of the injection valve (2.1, 2.2, 2.3) is produced along an annular connection geometry (20).

3. The method according to claim 2, wherein, during the materially adhesive joining process, an electrical contact (17, 19) is produced between the fuel rail (1) and the injection valve (2.1, 2.2, 2.3).

4. The method according to claim 2, wherein, during the joining of the injection valve body (22) to the fuel rail (1), the electrical contact (27) is produced inside a contacting recess (26) that can be encapsulated.

5. The method according to claim 1, wherein, during the production of the one-piece injection molded fuel rail (30), the preassembled unit (38) of an injection valve (2.1, 2.2, 2.3) is affixed in an insertion position (36) in a materially adhesive fashion inside the fuel rail (30) by means of a pre-molded part (33).

6. The method according to claim 5, wherein, during the injection molding process the cores, which define the hollow chamber (12) and the insertion position (36) of the insertion unit (38) in the one-piece fuel rail (30), and the electrical contacts (31, 32) are positioned and secured in an injection molding die.

7. The method according to claim 1, wherein during the injection molding process a central plug connection (15) is positioned and secured in an injection molding die and is injection molded onto the fuel rail (30).

* * * * *